United States Patent [19]
Allen, Jr. et al.

[11] Patent Number: 5,169,485
[45] Date of Patent: Dec. 8, 1992

[54] METHOD FOR THE PREPARATION OF EPITAXIAL FERROMAGNETIC MANGANESE ALUMINUM MAGNETIC MEMORY ELEMENT

[75] Inventors: Silas J. Allen, Jr., Summit; James P. Harbison, Fair Haven; Mark L. Leadbeater, Shrewsbury Township, Monmouth County; Ramamoorthy Ramesh, Eatontown; Timothy D. Sands, Cranbury, all of N.J.

[73] Assignee: Bell Communications Research, Inc., Livingston, N.J.

[21] Appl. No.: 665,665

[22] Filed: Mar. 7, 1991

[51] Int. Cl.⁵ .............................. C30B 30/00
[52] U.S. Cl. ................... 156/603; 156/610; 156/611; 156/613; 156/614; 156/DIG. 61; 156/DIG. 73; 156/DIG. 103
[58] Field of Search ............. 156/603, 610, 611, 613, 156/614, DIG. 61, DIG. 73, DIG. 103

[56] References Cited

U.S. PATENT DOCUMENTS

| | | | |
|---|---|---|---|
| 3,146,137 | 8/1964 | Williams | 156/614 |
| 3,399,072 | 8/1968 | Pulliam | 156/614 |
| 3,839,084 | 10/1974 | Cho et al. | 156/611 |
| 4,829,022 | 5/1989 | Kobayashi et al. | 156/612 |

OTHER PUBLICATIONS

"Synthesis of Ferromagnetic & Phase of Mn–Al films by sputtering;" Marisako et al.; *Journal Applied Physics* vol. 61(8); Apr. 15, 1987.

"Epitaxial Ferromagnetic & MnAl films on GaAs;" Sands et al.; *Applied Physics Letters*; vol. 57(24), Dec. 10, 1990.

*Primary Examiner*—Robert Kunemund
*Assistant Examiner*—Felisa Garrett
*Attorney, Agent, or Firm*—Leonard Charles Suchyta; Lionel N. White

[57] ABSTRACT

A non-volatile memory element based upon a thin epitaxial film of manganese aluminum upon a III-V semiconductor is described. The film is stable at elevated temperatures required for III-V semiconductor device processing, so permitting the monolithic integration of non-volatile memory elements with III-V semiconductor electronic and photonic devices.

4 Claims, 2 Drawing Sheets

METHOD FOR THE PREPARATION OF EPITAXIAL FERROMAGNETIC MANGANESE ALUMINUM MAGNETIC MEMORY ELEMENT

FIELD OF THE INVENTION

This invention relates to a thin film magnetic memory element useful for the storage and retrieval of information. More particularly, the present invention relates to a magnetic memory element comprising an epitaxial ferromagnetic manganese aluminum (tau phase) film deposited upon a III-V semiconductor.

The growth and magnetic properties of epitaxial ferromagnetic elemental films grown on compound semiconductor substrates has been a subject of intense interest for the past decade. The motivation for this effort resides in the fact that nearly defect-free epitaxial magnetic films can be grown on compound semiconductor substrates which facilitates the study of magnetic effects in ultrathin films, and the resultant heterostructures afford the opportunity to combine magnetic and magneto-optic devices with compound semiconductor electronic and photonic devices.

It has usually been found that the magnetization vector of such films lies in the plane of the film, so minimizing the free energy of the system, particularly in high symmetry ferromagnetic materials such as iron. However, for many magnetic or magneto-optic recording applications, a magnetization vector normal to the substrate surface is required. Accordingly, the magnetic film selected must evidence structural anisotropy such that the film normal is the easy magnetization direction. Thus, for example, the forces that tend to align the magnetization in the plane have been overcome by creating an artificial silver-iron superlattice. By tuning the magnetic interactions between the iron layers (by varying the film thickness and the superlattice period), a perpendicular magnetization has been attained. An alternative technique for achieving the same goal involves selecting a ferromagnetic phase with crystalline anisotropy (for example, tetragonal), which can be grown as an epitaxial film with the unique easy magnetization direction (the c-axis) normal to the semiconductor substrate. A further advantage of an epitaxial single-crystal film is that the uniformity of the magnetic properties of the film will not be limited by grain boundaries and grain-size effects. Such uniformity is essential to fabricating submicron magnetic storage elements. Heretofore, this type of ferromagnetic phase has not been available.

In accordance with the present invention, the noted prior art limitation has been effectively obviated by means of a method which involves depositing the tetragonal ferromagnetic phase $\tau$-MnAl on a semiconductor substrate with the c-axis aligned parallel to the surface normal of the substrate. The resultant film has been found to be stable at temperatures of the order of 500° C. which are normally required for III-V semiconductor growth and device processing, so permitting the monolithic integration of non-volatile memory elements with III-V semiconductor electronic and photonic devices. The tau phase of manganese aluminum is a ferromagnetic phase evidencing strong uniaxial anisotropy. Thus, magnetic moments will tend to align either parallel or anti-parallel with the unique c-axis of the tetragonal unit cell. Such a configuration permits the reading of data by the polar magneto-optic Kerr effect or by sensing the extraordinary Hall voltage.

The invention will be more readily understood by reference to the following detailed description taken in conjunction with the accompanying drawing wherein.

The $\tau$-MnAl phase which is the subject of the present invention is the only ferromagnetic phase in the bulk manganese-aluminum system. The composition of this phase is approximately $Mn_{54}Al_{46}$, a bulk metastable phase that is formed by rapidly cooling the high temperature hexagonal phase to room temperature through a eutectoid at approximately 870° C. The structure of this tau phase of manganese aluminum is tetragonal with $a_o = 0.277$ nm and $c_o = 0.354$ nm. The phase evidences a Curie temperature of 380° C., a saturation magnetization, $4\pi M_s$, of 6200 G and a large uniaxial magnetocrystalline anisotropy, characterized by a crystalline anisotropy field of 40 kOe.

The first step in the growth process involves selection of a III-V substrate. Although gallium arsenide was chosen for this purpose, it will be understood by those skilled in the art that other III-V compounds such as InP may be used for this purpose. The film described herein may be grown by conventional molecular beam epitaxy in a growth chamber equipped with effusion cell sources for arsenic, aluminum, gallium and manganese or by conventional chemical vapor deposition technique. The gallium arsenide substrate including a terminating layer of aluminum arsenide is then grown. Following, a thin amorphous film of manganese aluminum is deposited at a substrate temperature below 100° C. The thickness of this layer may vary from 1-14 $\tau$-MnAl unit cells (ranging from 0.3 to 5.0 nm). This layer may be formed by sequentially depositing alternating Mn and Al films, or by codeposition. Then, the amorphous layer is heated to a temperature of the order of 100° C. to yield a monocrystalline template with the tau phase manganese aluminum structure. The temperature and rate at which this transformation occurs are dependent upon the amorphous layer thickness and on the order in which the monolayers are deposited. Upon attaining the tau phase template of (001) orientation, the substrate is heated to a temperature within the range of 160°–210° C. and further growth may be accomplished by codeposition of manganese and aluminum at a growth rate of approximately 1 nm/minute. The final film thickness is a sensitive function of growth temperature and may range from 3 to 80 nm with an optimum growth temperature of approximately 170° C. A post-growth anneal at about 400° C. completes the formation of a well-ordered epitaxial layer of the tau phase.

Figure 1:
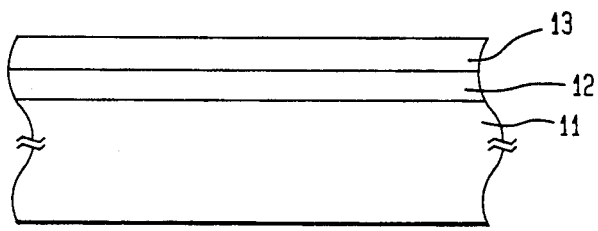
FIG. 1 is a front elevational view in cross section of an epitaxial film of the invention deposited upon a semiconductor substrate.

With reference now to FIG. 1, there is shown a front elevational view in cross-section of the structure grown in the foregoing manner. Shown is a gallium arsenide substrate 11, having disposed thereon a thin barrier layer of aluminum arsenide 12 and an epitaxial layer of manganese aluminum 13.

In a given magnetic domain of the film, information is stored as a "0" or "1" depending upon whether the magnetic moments are "up" or "down". The orientation of the moment in a given domain can be read using either the Hall effect (electrical) or the magneto-optic Kerr effect (optical). Writing is accomplished by heating the spin system, either by the passage of a current pulse or by the absorption of light from a focused laser souce, to an effective temperature that is above or slightly below the Curie temperature (the temperature above which the spin system is disordered) in the presence of a biasing magnetic field. A lithographically patterned array of these magnetic storage elements may be interconnected and controlled by III-V electronic devices to create non-volatile random access on-chip memory with the potential of extremely fast read/write characteristics. This memory array, when addressed and controlled electronically has no moving parts and may be patterned with submicron features (very-large-scale-integration). The large room temperature coercivity (>2 kOe) and relatively high Curie temperature (approximately 200°-380° C. depending upon composition) of the described manganese aluminum based films provides a non-volatile data storage medium that is immune to data loss from stray magnetic fields or elevated ambient temperatures.

Figure 2:
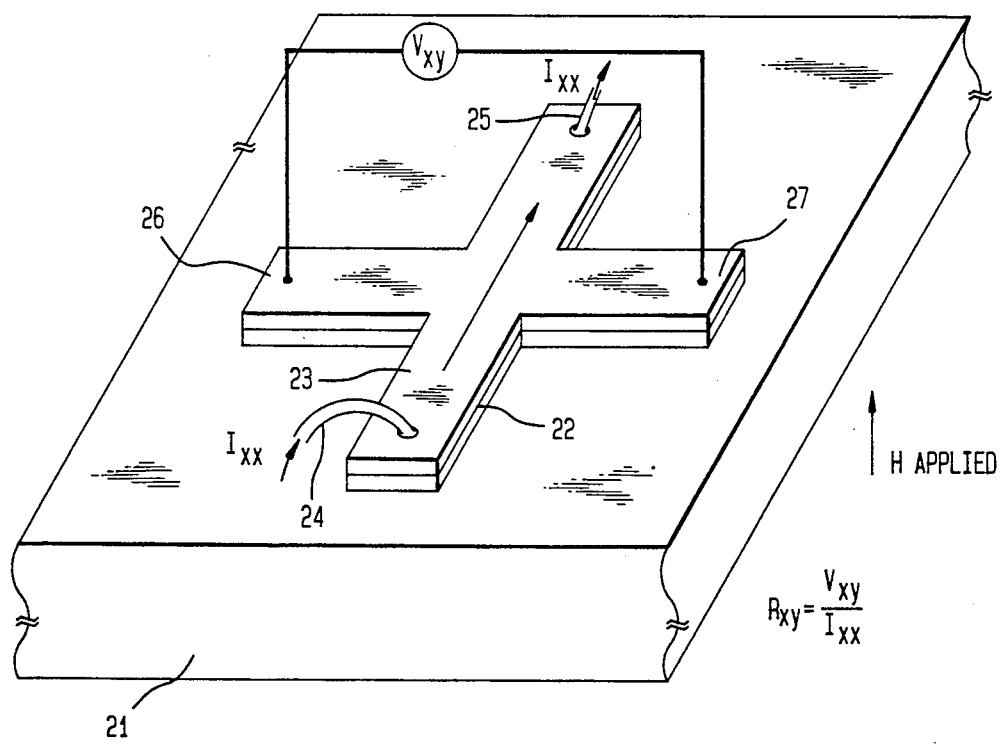
FIG. 2 is a perspective view of a patterned manganese-aluminum film of the invention upon a III-V semiconductor together with means for measuring the Hall resistance of the film.

With reference now to FIG. 2, there is shown in perspective a typical on-chip memory element in accordance with the present invention. Shown is a gallium arsenide substrate 21 having deposited thereon a thin barrier layer of aluminum arsenide 22 and a thin lithographically patterned film of manganese aluminum 23. Film 23 is contacted by a pair of opposing current leads 24 and 25 and a pair of opposing voltage probes 26 and 27 at a 90 degree angle to current leads 24 and 25. These leads may be relatively thick non-magnetic metallic films patterned lithographically. In operation, writing may be effected by sending a current pulse through the manganese aluminum film. Joule heating or direct heating of the spin system reduces the coercivity of the magnetic film to a value lower than the applied field that is parallel or antiparallel to the film normal. Upon cooling, the manganese aluminum film adopts a magnetization parallel to the biasing applied field. The biasing field can be provided from an external magnet or by currents flowing in the associated circuitry. Reading is effected by using the high impedance voltage probes to measure the sign of the extraordinary Hall resistance. Since this memory element is addressed electronically and without moving parts, the data transfer rate (reading) is extremely rapid and mechanical wear associated with moving heads or disks is eliminated. The writing process as well is not burdened by the inertia of moving heads or rotating disks. Other advantages include the fact that speed is enhanced by the ability to incorporate electronic devices in close proximity to the magnetic memory elements, and since storage is magnetic, the memory is non-volatile and does not require refreshing or battery backup. Furthermore, the epitaxial nature of the film results in magnetic properties that are not limited by grain-size effects. Thus, the MnAl memory element can be fabricated with submicron dimensions consistent with very high areal bit densities.

Figure 3:
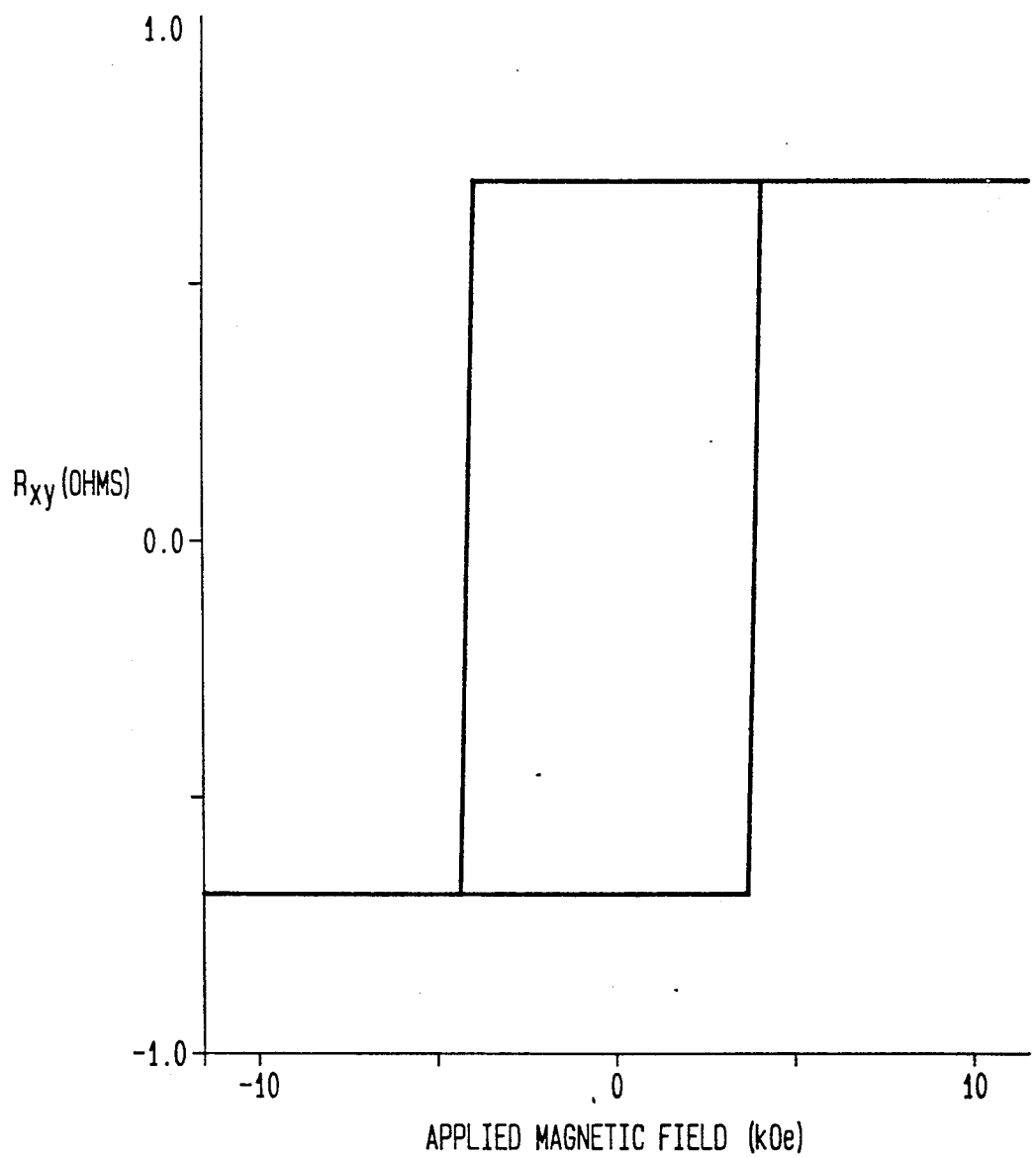
FIG. 3 is a graphical representation on coordinates of applied magnetic field, H, against Hall resistance, $R_{xy}$, showing the hysteresis loop attained for the deposited film of FIG. 2.

With reference now to FIG. 3, there is shown a graphical representation on coordinates of applied magnetic field, H, against Hall resistance, $R_{xy}$, showing measurements of extraordinary Hall effect at 295K for a 10 nm thick manganese aluminum film grown by the described method. The hysteresis loop shown in the figure is extremely square, so indicating uniform film properties.

While the invention has been described in detail in the foregoing description and drawing, it will be appreciated by those skilled in-the-art that variations may be made without departing from the spirit and scope of the invention. Thus, it will be understood that reading may be effected by means of the magneto-optic Faraday or Kerr effect. In this procedure, an incident plane polarized light travels in an ordered magnetic medium and the differences in indices of refraction for left and right circularly polarized light induces an ellipticity to the polarization, so resulting in rotation of the major axis of polarization. The light which escapes from the medium, either in reflection or transmission can then be analyzed to determine the direction and degree of rotation.

Additionally, it will be understood that writing may be effected with laser heating rather than Joule heating. And, lastly, film properties may be altered by alloying the manganese aluminum with nickel, copper or carbon.

We claim:

1. Method for the growth of $\tau$-MnAl on a III-V semiconductor substrate which comprises the steps of:
   (a) depositing a thin film of Mn and Al on a semiconductor surface at a temperature below 100° C. so as to form an amorphous layer with thickness between 0.3 and 5 nm;
   (b) heating the resultant amorphous layer to a temperature of the order of 100° C. to yield a monocrystalline template with the $\tau$ phase of manganese aluminum;
   (c) heating the template to a temperature within the range of 160°-210° C. and effecting co-deposition of manganese and aluminum to yield a final film of a thickness ranging film 3-59 nm; and
   (d) annealing the resultant film at a temperature of the order of 400° C.

2. Method in accordance with claim 1 wherein co-deposition is effected at 170° C.

3. Method in accordance with claim 1 wherein deposition is effected by molecular beam epitaxy.

4. Method in accordance with claim 1 wherein deposition is effected by chemical vapor deposition techniques.

* * * * *